United States Patent
Dragoi et al.

(10) Patent No.: US 10,502,773 B2
(45) Date of Patent: Dec. 10, 2019

(54) SYSTEM AND METHOD FOR DIAGNOSING ELECTRICAL FAULTS

(71) Applicant: Connaught Electronics Ltd., Tuam, County Galway (IE)

(72) Inventors: Beniamin Dragoi, Tuam (IE); Sergio Bantiles, Tuam (IE)

(73) Assignee: Connaught Electronics Ltd., Tuam, County Galway (IE)

( * ) Notice: Subject to any disclaimer, the term of this patent is extended or adjusted under 35 U.S.C. 154(b) by 202 days.

(21) Appl. No.: 15/678,720

(22) Filed: Aug. 16, 2017

(65) Prior Publication Data
US 2019/0056444 A1 Feb. 21, 2019

(51) Int. Cl.
*G01R 31/00* (2006.01)
*G07C 5/08* (2006.01)
*G01R 31/02* (2006.01)
*H04B 3/46* (2015.01)

(52) U.S. Cl.
CPC ......... *G01R 31/006* (2013.01); *G01R 31/025* (2013.01); *G07C 5/0808* (2013.01); *H04B 3/46* (2013.01)

(58) Field of Classification Search
CPC .. G01R 31/025; G01R 31/006; G07C 5/0808; H04B 3/46
USPC ....... 324/503, 500, 509, 512, 522, 527, 528, 324/537, 538, 764.01, 555, 6; 702/1, 57, 702/58, 59, 127, 182, 183, 185
See application file for complete search history.

(56) References Cited

U.S. PATENT DOCUMENTS

| | | | | |
|---|---|---|---|---|
| 4,574,266 A | * | 3/1986 | Valentine | G01R 31/006 340/458 |
| 2008/0259515 A1 | * | 10/2008 | Turpin | H02H 3/12 361/98 |
| 2013/0187445 A1 | * | 7/2013 | Mutzabaugh | H04B 3/548 307/1 |
| 2017/0047841 A1 | * | 2/2017 | Zojer | H01L 27/0629 |

* cited by examiner

*Primary Examiner* — Melissa J Koval
*Assistant Examiner* — Courtney G McDonnough
(74) *Attorney, Agent, or Firm* — Osha Liang LLP

(57) ABSTRACT

A load device coupled to an output of an ECU via a coaxial cable is disclosed. The ECU provides power to the load device, and has a power over coaxial cable (PoC) filter coupled to the output, a high side switch (HSS) coupled to the power supply and to the PoC filter via an HSS output line, a diode disposed in the HSS output line that eliminates current flow from the output towards the HSS, while allowing current flow from the HSS towards the load device, a diode resistor in parallel with the diode that allows a current to flow past the diode towards the HSS while a short-to-battery scenario is occurring, and a pull down resistor (RPD) disposed between the output line of the HSS and a ground prior to the diode configured to pull the voltage at the HSS output down to zero while an open load scenario is occurring.

18 Claims, 3 Drawing Sheets

SYSTEM AND METHOD FOR DIAGNOSING ELECTRICAL FAULTS

BACKGROUND

Power-over-Coaxial cable (PoC) systems often provide power, at least in part, to load devices through coaxial cables using a power supply. Between the coaxial cable and the power source often exists a high side switch (HSS) that connects or disconnects the power source from the load device. Sometimes, however, the output to the load device or attached cabling may experience a fault condition. Such fault conditions may include a short condition (e.g., a short to some unintended power source such as a battery) or an open load condition (e.g., a load device is disconnected).

SUMMARY

In general, in one aspect the invention relates to a system, comprising a load device coupled to an output of an electronic control unit (ECU) via a coaxial cable, and the ECU. The ECU includes a power supply configured to provide power for the load device, a power over coaxial cable (PoC) filter coupled to the output, a high side switch (HSS) coupled to the power supply and to the PoC filter via an HSS output line, a diode disposed in the HSS output line and configured to substantially eliminate current flow from the output towards the HSS, while allowing current to flow from the HSS towards the load device from the HSS, a diode resistor (RD) disposed in parallel with the diode an configured to allow a current to flow past the diode towards the HSS while the HSS is in an off mode and a short-to-battery scenario is occurring, and a pull down resistor (RPD) disposed between the output line of the HSS and a ground prior to the diode, and configured to pull the voltage at the HSS output down to zero volts while the HSS is in the off mode and an open load scenario has occurred.

A method, comprising configuring an electrical control unit (ECU) to include a diode positioned between a power supply and a load device, providing power to the load device from the ECU, initiating a test to determine a fault scenario, placing a high side switch (HSS) into an off mode, measuring a voltage at the output of the HSS, detecting that the voltage is zero volts, determining, based on detecting zero volts, that an open load scenario has occurred, and reporting the open load scenario to a controller.

Other aspects of the invention will be apparent from the following description and the appended claims.

DETAILED DESCRIPTION

Figure 1:
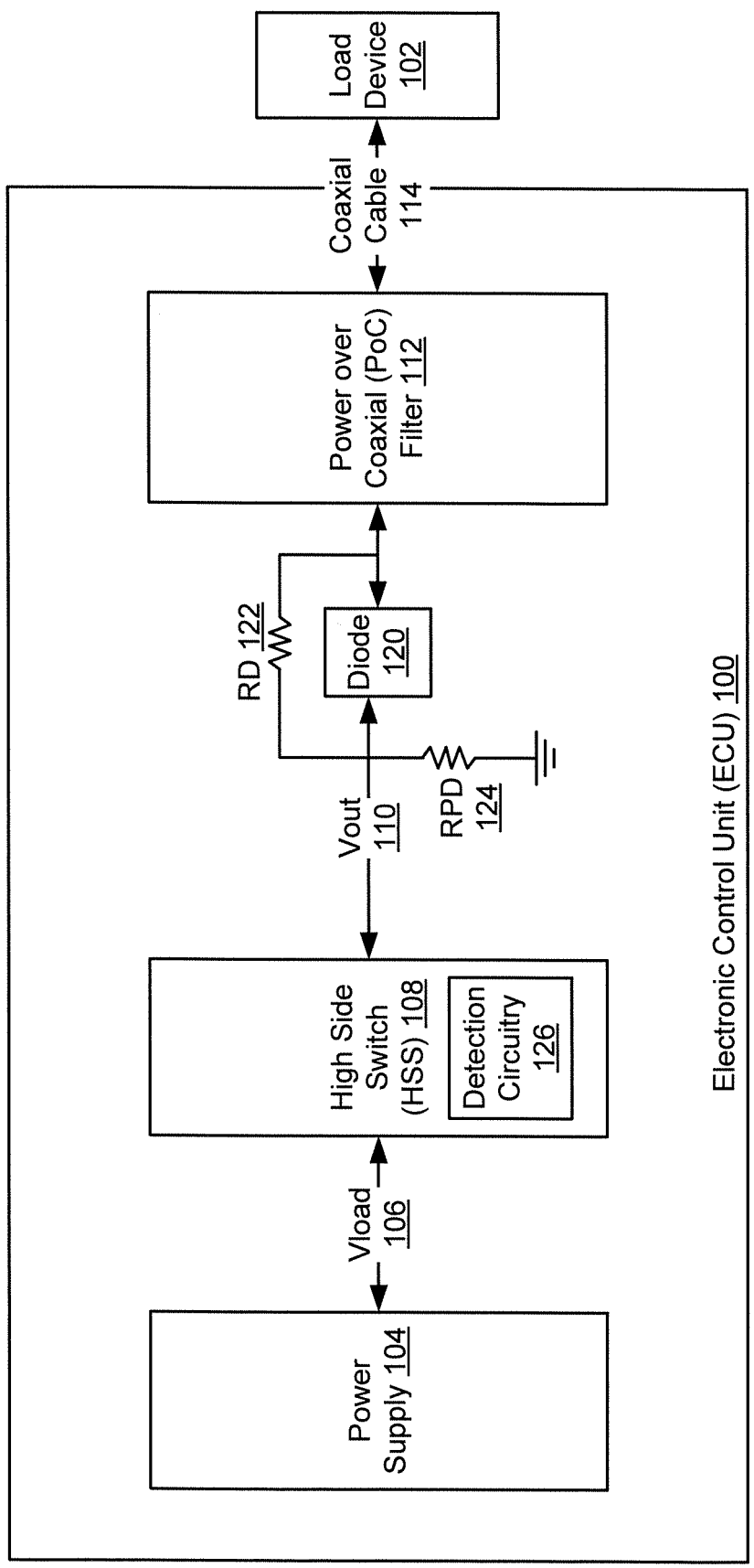
FIG. 1 shows a system in accordance with one or more embodiments of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Further, although the description includes a discussion of various embodiments of the invention, the various disclosed embodiments may be combined in virtually any manner. All combinations are contemplated herein.

In general, embodiments of the invention relate to a system and method for protecting a high side switch (HSS) and/or other system components from reverse current flow by inserting a diode between the HSS and a load device, and also determining whether the system is experiencing an open load scenario or a short-to-battery scenario. In one or more embodiments of the invention, the diode is inserted with a polarity that allows for current to flow from the HSS towards the load device, but substantially eliminates current flow from the load device, or any other post HSS component (e.g., a shorted coaxial cable) back towards the HSS. Additionally, a pull down resistor (herein referred to as RPD) is placed into the circuit after the HSS but before the diode, and connects the output line of the HSS to ground. Also, a diode resistor (herein referred to as RD) that is placed in parallel with the diode. During an open load scenario, detection circuitry included in the HSS will detect an output voltage of zero while the HSS is in off mode (i.e., not providing power for the load device), due at least in part to the RPD. During a short-to-battery scenario, the RD in parallel with the diode allows for a small amount of current (because the resistance of RD is high) to flow back towards the HSS (due to the difference between the relatively high voltage of the battery and the relatively low voltage at the output of the HSS), which allows the detection circuitry of the HSS to detect a present voltage at the output while the HSS is in off mode. The difference in voltage detected between the two scenarios allows for differentiation between the two, and thus may inform a monitoring entity which fault type is occurring in the system.

Turning now to the figures, FIG. 1 is a block diagram of an exemplary system in accordance with one or more embodiments of the invention. As shown in FIG. 1, the system includes an electronic control unit (ECU) (100) coupled to a load device (102) via a coaxial cable (114). The ECU (100) may include a power supply (104), a high side switch (HSS) (108), a diode (120), and a power over coaxial (PoC) filter (112). Each of these components is described below.

In one or more embodiments of the invention, a load device (102) is a device or set of devices that act as a load in an electrical system. In one or more embodiments of the invention, the load device (102) is an electrical component, circuitry, or a portion of a device or circuitry that consumes electricity. Examples of load devices include, but are not limited to, appliances, lights, cameras, circuits requiring external power, etc. Although FIG. 1 shows a single load device (102), embodiments of the invention may include any number of load devices coupled to an ECU (100) without departing from the scope of the invention.

In one or more embodiments of the invention, as mentioned above, the load device (102) is connected to an ECU (100) via a coaxial cable (114). In one or more embodiments of the invention, a coaxial cable (114) is any cable that includes more than one layer, with multiple layers substantially sharing a central axis. In one or more embodiments of the invention, the coaxial cable (114) includes, at least, an inner conducting layer and an outer conducting layer (sometimes referred to as a shield) separated by an insulating layer. The coaxial cable (114) may have any number of layers. For example, in addition to the aforementioned three layers, the coaxial cable (114) may include an outer sheathing layer designed to protect the cable. In normal operation, the coaxial cable (114) should provide electrical connections between a load device and the ECU (100). However, in some situations, the coaxial cable (114) may be compromised or damaged in some way. For example, in an automotive scenario, the coaxial cable (114) may become electrically connected to a battery of an automobile. Such a situation may create a short between the load device/ECU and the battery, which may be referred to as a short-to-battery scenario. In one or more embodiments of the invention, there exists a coaxial cable for each load device coupled to an ECU (100).

In one or more embodiments of the invention, the ECU (100) is any device or set of devices for providing electrical control of a load device (102). Such control may include, but is not limited to, providing power to the load device (102), as well as receiving data from the load device (102). For example, in scenarios where the load device (102) is a camera, the ECU (100) may provide power to the camera, while receiving camera data from the camera. In such an example, the power provided to the load device (102) may be transmitted using one conducting layer of a coaxial cable (114), while the data from the load device (102) is transported to the ECU (100) using the same conducting layer of the coaxial cable (114).

In one or more embodiments of the invention, the ECU (100) includes, is, or is a portion of a computing device. In one or more embodiments of the invention, a computing device is any device or any set of devices capable of electronically processing instructions and that includes at least the minimum processing power, memory, input and output device(s), and/or network connectivity in order to contribute to the performance of at least some portion of the functions described herein in accordance with one or more embodiments of the invention. Examples of computing devices include, but are not limited to, devices that include field programmable gate arrays (FPGAs), application specific integrated circuits (ASICs), one or more microcontrollers, one or more processors (e.g., central processing units), one or more graphics processing units (GPUs), a server (e.g., a blade-server in a blade-server chassis), a virtual machine (VM), a desktop computer, a mobile device (e.g., laptop computer, smart phone, personal digital assistant, tablet computer, and/or any other mobile computing device), and/or any other type of computing device with the aforementioned minimum requirements. In one or more embodiments of the invention, the ECU (100) includes or is operatively connected to one or more other computing devices, with which it may exchange information. For example, the ECU (100) may receive video data from a camera attached via the coaxial cable (114), and include functionality to process the data and/or to send the data to another computing device for processing (or further processing). As another example, the ECU may include elements that perform detection and/or diagnosis of system conditions, and such information may be transmitted to an external entity.

In one or more embodiments of the invention, the ECU (100) includes a power supply (104). In one or more embodiments of the invention, a power supply (104) is any device capable of supplying electrical power to any other device. A power supply (104) may be a device that internally generates electricity and/or that receives electricity from any outside source for further propagation. In one or more embodiments of the invention, a power supply (104) is capable of transforming electrical energy into a form consumable by attached load devices (e.g., load device (102)).

In one or more embodiments of the invention, the power supply (104) is a switched mode power supply (SMPS). A SMPS may have two or more modes or states that the power supply (104) is capable of switching between during operation to achieve various goals such as, for example, lower energy dissipation. In one or more embodiments of the invention, the power supply (104) includes functionality to regulate voltage output from the power supply (104). Other examples of power supplies include, but are not limited to, direct current power supplies, alternating current power supplies, linear power supplies, programmable power supplies, uninterrupted power supplies, etc. In one or more embodiments of the invention, the power supply (104) includes functionality to provide power for a load device (102) that may be referred to as the load voltage ($V_{load}$) (106), which serves as the input voltage to the HSS (108).

In one or more embodiments of the invention, the ECU (100) includes an HSS (108) coupled to the power supply (104). In one or more embodiments of the invention, a HSS (108) is a switching element capable of connecting and disconnecting a power supply (104) from a load device (102), or other elements leading to a load device. In one or more embodiments of the invention, a HSS (108) includes one or more transistors, such as a field effect transistor (FET) (not shown). Each transistor may serve to allow current to pass and thus provide power to any number of load devices (e.g., there may exist a FET for each coupled load device).

In embodiments of the invention where the HSS (108) includes one or more FETs such as a metal oxide semiconductor FET (MOSFET), the FET may be configured in such a way as to allow for the application of certain levels of voltage to the gate terminal to control whether current passes between the drain and source terminals, and thus between the power supply (104) and a load device (102). In one or more embodiments of the invention, a FET may include an intrinsic body diode (not shown) between the body of the transistor and the source and/or drain terminals. In one or more embodiments of the invention, the body diode may allow for current to flow between the drain and source terminals of the transistor via the body of the FET. For example, in a circuit in which a path exists between a gate and a source terminal, the body diode may allow current to flow from the drain terminal to the body of the transistor, and from the body of the transistor to the source terminal.

In one or more embodiments of the invention, the HSS (108) includes any amount of additional circuitry for performing various functions. For example, the HSS (108) may include additional circuitry for making voltage measurements used to perform diagnostics related to the ECU (100), the HSS (108), and/or the load device (102). As shown in FIG. 1, such circuitry may include detection circuitry (126).

Detection circuitry (126) may be any circuitry that includes functionality to measure voltage at the output of the HSS (108). In one or more embodiments of the invention, the detection circuitry (126) includes functionality to measure the voltage at the output of the HSS (108) while the HSS is in off mode (i.e., configured to not provide power for attached load devices). Such measurements may allow for distinction between an open load scenario (e.g., a load device has become disconnected) and a short-to-battery scenario (e.g., a cable leading to the load device is shorted to a battery).

In one or more embodiments of the invention, the ECU (100) includes a PoC filter (112). In one or more embodiments of the invention, the PoC filter (112) is coupled between the HSS (108) and the coaxial cable (114) leading to the load device (102). In one or more embodiments of the invention, the PoC filter (112) is a collection of circuitry for performing one or more functions before power reaches a load device (102). For example, a PoC filter (112) may perform impedance matching before power from the power supply (104) via the HSS (108) is provided to the load device (102). In one or more embodiments of the invention, though not shown in FIG. 1, there may be any number of PoC filters in the ECU, each coupled to a separate load device.

In one or more embodiments of the invention, the coupling between the PoC filter (112) and the HSS (108) includes a diode (120). In one or more embodiments of the invention, a diode (120) is a circuit element that allows current to flow with little or no impedance in one direction, but prevents or substantially prevents current flow in the opposite direction. In one or more embodiments of the invention, the diode (120) includes a polarity that dictates which direction the diode allows current to flow. In one or more embodiments of the invention, the diode (120) is inserted between the HSS (108) and the PoC filter (112) with a polarity that allows for current to flow from the HSS (108) towards the PoC filter (112), but prevents or substantially prevents current from flowing from the load device (102) or PoC filter (112) towards the HSS (108) (e.g., in a short-to-battery scenario). In one or more embodiments of the invention, the diode (120) passes current from the HSS (106) towards one or more load devices (e.g., load device 102) due to a voltage $V_{out}$ (110) provided from the HSS (108) while the HSS is biased to allow one or more current flows from the power supply (104) (e.g., FET gates are biased to allow current between the source and drain terminals).

In one or more embodiments of the invention, the ECU (100) includes a RPD (124). The RPD (124) may be placed on a line connecting the output line from the HSS (108) to ground. In one or more embodiments of the invention, the RPD serves to pull down the output of the HSS (108). In one or more embodiments of the invention, pulling down the output of the HSS (108) serves to ensure that when the HSS is not providing power for the load device (102) from the power supply (104) (i.e., the HSS is in an off mode), the voltage of the HSS output line is effectively held to zero. In one or more embodiments of the invention, the RPD has a relatively large value (e.g., 100 kilo-ohms), thereby only drawing a small amount of current through the RPD in either an OFF or ON HSS configuration.

In one or more embodiments of the invention, the ECU (100) includes a resistor RD (122). In one or more embodiments of the invention, the RD is positioned to be in parallel with the diode (120). In one or more embodiments of the invention, the RD (122) in parallel with the diode allows for some current to flow past the diode. For example, in a short-to-battery scenario, the diode (120) would normally prevent current flow from the short towards the HSS (108), and potentially through the body diodes of the FETs of the HSS (108) to the power supply (104), HSS circuitry (e.g., detection circuitry (126)), and/or other load devices (not shown). However, with the RD (122) existing in parallel with the diode (120), a small amount of current can flow from the short towards the HSS (108), which the detection circuitry (126) of the HSS (108) includes functionality to detect as a voltage at the output of the HSS (108). In one or more embodiments of the invention, the RD (122) has a relatively high value (e.g., 10 kilo-ohms). The high value of the RD (122) limits the amount of current that is able to flow towards the HSS (108) to small enough levels to prevent harm to the HSS (108) or any other system component (e.g., the power supply, other load devices, etc.).

In one or more embodiments of the invention, while the HSS is in OFF mode (i.e., not providing power for the load device), without the presence of RD (122) and RPD (124) the detection circuitry would detect the same output voltage in an open load scenario as in a short to battery scenario. This is because there would be no power output of the load was disconnected, and in the short-to-battery scenario the diode would prevent current flow, leading to the same voltage at the output of the HSS (108). However, with the RD (122) and the RPD (124) present as described herein, the detection circuitry (126) of the HSS (108) will detect zero volts in the open load scenario (due at least in part to the RPD (124)), and at least some voltage in the short-to-battery scenario due to RD (122) allowing some current to flow past the diode (120).

In one or more embodiments of the invention, though not shown in FIG. 1, the detection of the fault type (open load scenario or short-to-battery scenario) may be reported to a controller (not shown) (e.g., a computing device, a microcontroller, etc.) that is included in or operatively connected to the ECU (100). In one or more embodiments of the invention, the detected scenario is then stored by the controller. The data may be reported when the fault occurs. For example, in an automobile, the data may be provided to a computing device of the automobile and then displayed in some way to the driver or any other interested party (e.g., an automobile technician). In one or more embodiments of the invention, the data related to the detected scenario may be stored to be viewed at a later time by an entity (person, connected computing device) for use in determining what type of fault occurred. In one or more embodiments of the invention, the data related to the detected scenario may be used when the fault is detected to determine whether to turn off the load device in order to protect the load device experiencing the fault scenario.

While FIG. 1 shows a configuration of components, other configurations may be used without departing from the scope of the invention. For example, various components may be combined to create a single component. As another example, the functionality performed by a single component may be performed by two or more components. As another example, there may be any number of load devices attached to the ECU, an HSS may include any number of individual switching elements, there may be any number of PoC filters, etc. As another example, each connected load device that has a diode on its output line from the HSS may have a separate RD and/or RPD. Accordingly, embodiments of the invention should not be considered limited to the specific arrangements of components and elements shown in FIG. 1.

Figure 2:
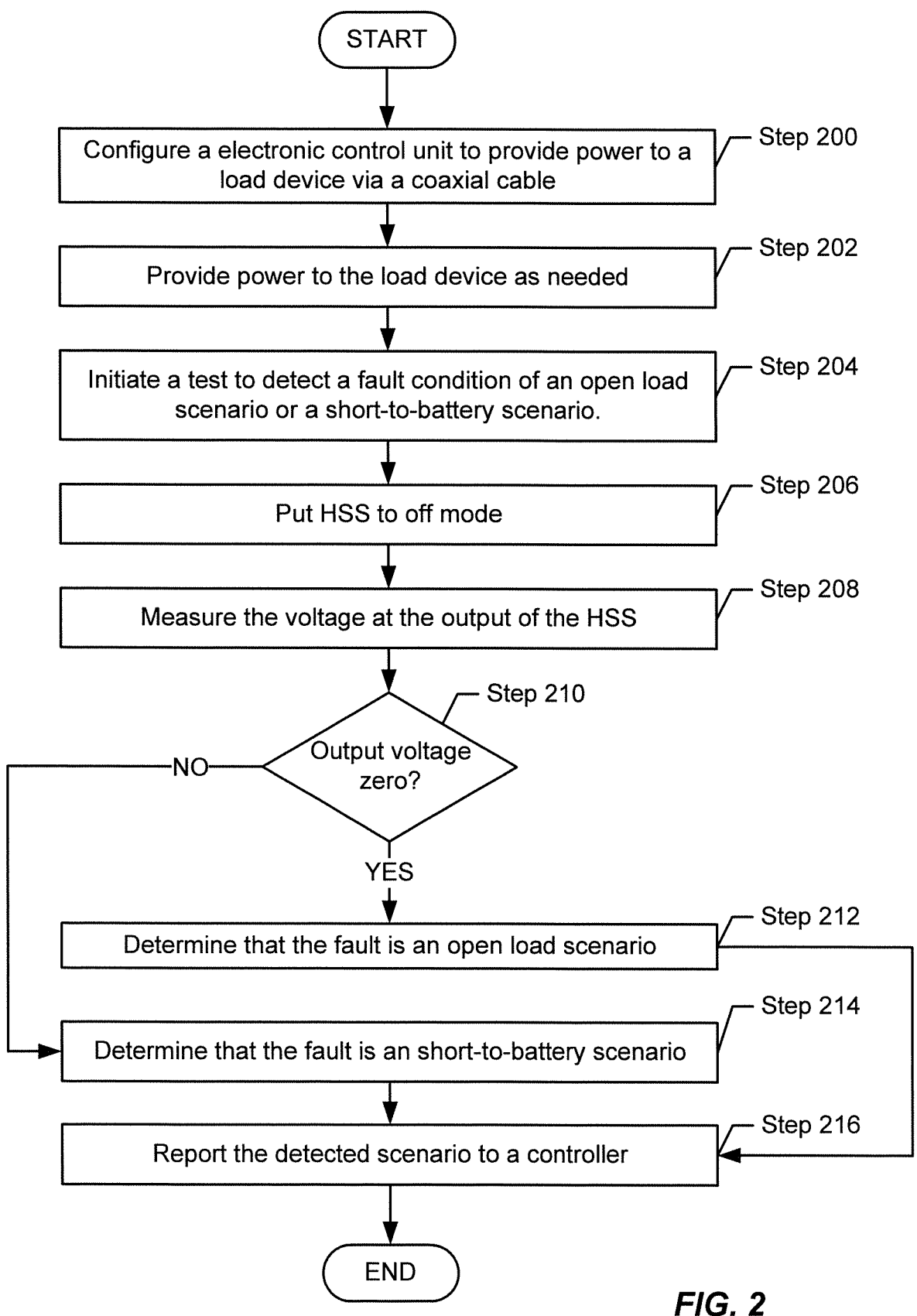
FIG. 2 shows a flowchart in accordance with one or more embodiments of the invention.

FIG. 2 shows a flowchart in accordance with one or more embodiments of the invention. While the various steps in this flowchart are presented and described sequentially, one of ordinary skill will appreciate that some or all of the steps may be executed in different orders, may be combined or omitted, and some or all of the steps may be executed in parallel. Furthermore, the steps may be performed actively or passively. As another example, determination steps may be performed by performing a test, such as checking a data value to test whether the value is consistent with the tested condition in accordance with one or more embodiments of the invention. As yet another example, determination steps may be performed via the configuration of system elements, such as an element configured to allow current flow in some situations, but prevent current flow in other situations.

FIG. 2 shows a flow chart describing an exemplary method detecting the difference between an open load scenario and a short-to-battery scenario.

In Step 200, an ECU is configured to provide power for a load device via a coaxial cable. In one or more embodiments of the invention, whether or not power is provided to the load device is controlled, at least in part, via a HSS located between and coupled to the HSS and the load device (or any other system component leading to the load device, such as a PoC Filter). For example, the HSS may include a FET connecting the power supply and the output to towards the load device (i.e., the HSS output line), and the gate voltage may be adjusted to connect and disconnect the power supply to an HSS output line.

In Step 202, power is supplied to the load device as needed. In one or more embodiments of the invention, the load device needs power when it is required to operate to perform any intended functionality. When power is not supplied to the load device, the HSS may cease the propagation of power towards the load device. For example, the HSS may include a transistor that may be biased by application of voltage to a terminal that prevents the passage of current between the other two terminals, one coupled to the power supply and the other leading to the load device. When the load device is required to operate or otherwise needs power, the voltage to the relevant terminal may be adjusted such that said current is able to flow between the other two terminals.

In Step 204, a test is initiated to determine whether an open load scenario or a short-to-battery scenario exists. In one or more embodiments of the invention, the test is initiated in response to a suspected fault. In other embodiments of the invention, the system is configured to initiate the test periodically, at certain times (e.g., when an automobile camera system is being activated), etc.

In Step 206, the test begins by placing the HSS in OFF mode. In one or more embodiments of the invention, the HSS is put into OFF mode by causing the gate voltage of the one or more FETs of the HSS to have a value that prevents current to flow between the other two terminals of the FET.

In Step 208, the voltage at the outputs of the HSS are measured. In one or more embodiments of the invention, each load device corresponds to a different FET in the HSS, and each FET leads to a separate output line leading to its respective load device. In one or more embodiments of the invention, the output voltage is measured on each output line.

In Step 210, a determination is made whether any output line from the HSS is at zero volts. If an output line is at zero volts, the process proceeds to Step 210. If, on the other hand, there is some voltage on the output line while the HSS is in OFF mode, the process proceeds to Step 214.

In Step 212, based on the detection of zero volts at the output of the HSS, a determination is made that the output line is experiencing an open load scenario. In one or more embodiments of the invention, the open load scenario means that the load device has become unattached from the ECU.

In Step 214, based the detection of a voltage on an output line of the HSS, a determination is made that the fault condition on that line is a short-to-battery scenario. In one or more embodiments of the invention, the short-to-battery scenario means that a cable leading to the load device has somehow become shorted to a battery (e.g., of an automobile).

In Step 216, the fault scenario determined to exist in either Step 212 or Step 214 is reported to a controller. In one or more embodiments of the invention, the controller stores the information. In one or more embodiments of the invention, the information is used to inform the user (e.g., the driver of a car), a technician, another computing device, etc. In one or more embodiments of the invention, the interested entity is informed when the fault occurs. In other embodiments, the information is stored and viewed later. In one or more embodiments of the invention, detection of either fault scenario may lead to the relevant load device being disabled or turned off to protect the load device.

Figure 3:
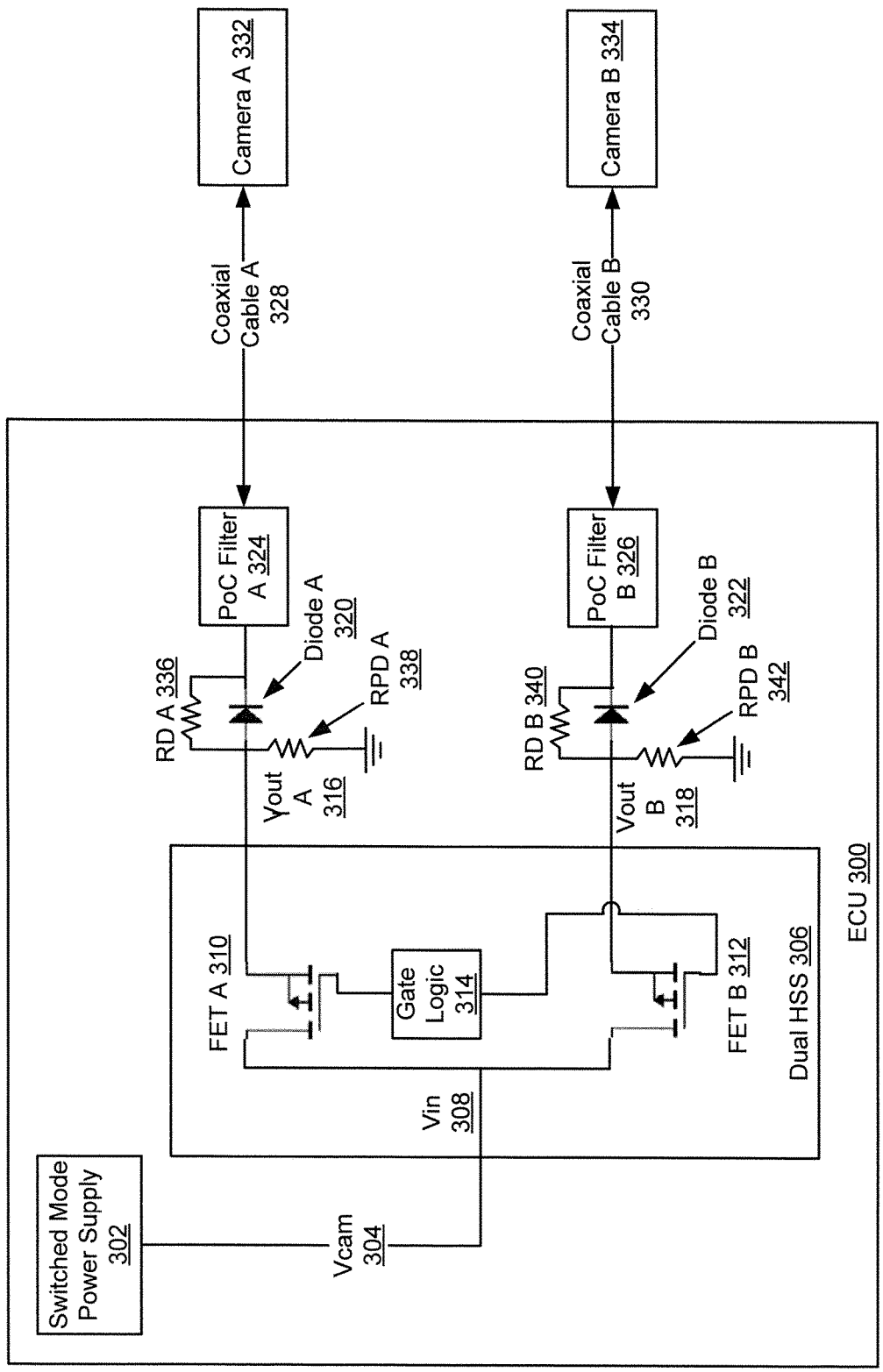
FIG. 3 shows an example in accordance with one or more embodiments of the invention.

FIG. 3 shows an example in accordance with one or more embodiments of the invention. The following example is for explanatory purposes only and not intended to limit the scope of the invention.

Referring to FIG. 3, consider a scenario in which an ECU (300) includes a switched mode power supply (SMPS) (302) coupled to a dual HSS (306). The dual HSS includes, among other circuitry not shown, two FETs (310, 312), each configured to allow the passage of current from the SMPS (302) to a respective camera (camera A (332), camera B (334)) of an automotive camera system. In such a scenario, the cameras (332, 334) are coupled to respective PoC filters (324, 326) via respective coaxial cables (328, 330). In turn, the PoC filters (324, 326) are coupled to terminals of respective FETs (310, 312). Between the PoC filters (324, 326) and the FETs (310, 312) are inserted diodes (320, 322) configured to allow current flow towards the PoC filter (due to the output voltages of the FETs (316, 318)), and to prevent current flow in the reverse direction. The SMPS (302) is configured to provide power to the cameras (332, 334) by way of a common voltage, shown as $V_{cam}$ (304). The FETs (310, 312) of the dual HSS (306) are configured to provide power to the cameras (332, 334) by way of an output voltage, shown as $V_{out}A$ (316) and $V_{out}B$ (318). The dual HSS (306) includes gate logic (314) configured to apply a voltage to the gates of the FETs (310, 312) in such a way as to allow the flow of current when the cameras (332, 334) require power via the coaxial cables (328, 330). For each output line from the dual HSS (306), there is an RPD (RPD A (338), RPD B (342)) between the output line and ground. Additionally, each output line from the HSS includes an RD (RD A (336), RD B (340)) in parallel with the diode (diode A (320), diode B (322))

In such a scenario, coaxial cable A (328) is inadvertently subjected to an unwanted path (not shown) to the battery of the automobile. However, the cameras (332, 334) are configured to receive a certain amount of power, and more or less power than expected may result in negative consequences for the camera system. In this scenario, the short results in the voltage supplied by the battery being higher than the voltage provided for camera A (332), whether such voltage is currently being provided to camera A (332) or not, as both situations have a high battery voltage versus a non-existent $V_{out}A$ (316) or a $V_{out}A$ (316) that is lower than the battery voltage. In either situation, a body diode (not shown) intrinsic to FET A (310), if subjected to the power from the battery, would allow for the passage of current to the input of FET A (310), and thereby to the input of FET B (312) and on towards camera B (334) and/or to the SMPS (302). However, as shown in FIG. 3, diode A (320) prevents such a situation by preventing the flow of current towards the output of FET A (310), and thus prevents the possible negative consequences of such power transmission. Additionally, diode A (320) prevents the transmission of energy back from the short-to-battery towards the SMPS (302). In order to detect such a scenario, the dual HSS (306) may be placed into OFF mode. While in OFF mode, the RD A (336), a 10 kilo-ohm resistor, allows for a small amount of current to flow past the diode toward the output of the dual HSS (306). Such current creates a voltage at the output of the HSS, which is detected by detection circuitry (not shown) of the dual HSS (306). The presence of the voltage determines that line leading to camera A (332) has been shorted to the automobile battery. The detection circuitry then reports the detected voltage, and this the short-to-battery scenario to a controller (not shown). The controller activates a display to the driver to alert the driver of the detected short-to-battery scenario, and camera A is turned off to protect camera A (332).

Sometime later, after the driver has had the short-to-battery scenario fixed, the coaxial cable A (328) is inadvertently severed, disconnecting camera A (332) from the ECU (300). In order to detect such a scenario, the dual HSS (306) may be placed into OFF mode. While in OFF mode, the RPD A (338), a 100 kilo-ohm resistor, pulls down the output of the HSS (306) to zero volts, which is detected by detection circuitry (not shown) of the dual HSS (306). The detection of zero volts determines that line leading to camera A (332) has been disconnected, leading to an open load scenario. The detection circuitry then reports the detected voltage, and the open load scenario to a controller (not shown). The controller activates a display to the driver to alert the driver of the detected open load scenario, and camera A is turned off to protect camera A (332).

Those skilled in the art will appreciate that there may be any number of HSS channel FETs (e.g., a quad HSS with 4 FETs), each of which may be paired with a diode in order to block a reverse current and protect the SMPS against short to external $V_{bat}$, and have an RD and RPD to detect an open load scenario or the short-to-battery scenario.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system, comprising:
a load device coupled to an output of an electronic control unit (ECU) via a coaxial cable; and
the ECU, comprising:
a power supply configured to provide power for the load device;
a power over coaxial cable (PoC) filter coupled to the output;
a high side switch (HSS) coupled to the power supply and to the PoC filter via an HSS output line;
a diode disposed in the HSS output line and configured to substantially eliminate current flow from the output towards the HSS, while allowing current to flow from the HSS towards the load device from the HSS;
a diode resistor (RD) disposed in parallel with the diode an configured to allow a current to flow past the diode towards the HSS while the HSS is in an off mode and a short-to-battery scenario is occurring; and
a pull down resistor (RPD) disposed between the output line of the HSS and a ground prior to the diode, and configured to pull the voltage at the HSS output down to zero volts while the HSS is in the off mode and an open load scenario has occurred.

2. The system of claim 1, wherein the load device is a camera.

3. The system of claim 1, wherein the ECU is a portion of an automobile system.

4. The system of claim 1, wherein the power supply is a switched mode power supply.

5. The system of claim 1, wherein the HSS comprises a plurality of field effect transistors.

6. The system of claim 5, wherein each of the plurality of field effect transistors is configured to connect and disconnect power from the power supply to a separate load device of a plurality of load devices.

7. The system of claim 1, wherein the coaxial cable provides power to the load device while also providing load device data to the ECU.

8. The system of claim 7, wherein the ECU is configured to process, at least in part, the load device data received from the load device.

9. The system of claim 1, further comprising:
a controller; and
detection circuitry configured to detect the voltage at the output of the HSS and report the detected voltage to the controller.

10. A method, comprising:
configuring an electrical control unit (ECU) to include a diode positioned between a power supply and a load device connected via a coaxial cable;
providing power to the load device from the ECU;
initiating a test to determine a fault scenario;
placing a high side switch (HSS) into an off mode;
configuring a diode resistor (RD) disposed in parallel with the diode to allow a current to flow past the diode towards the HSS while the HSS is in the off mode and a short-to-battery scenario is occurring;
configuring a pull down resistor (RPD) disposed between the output line of the HSS and a ground prior to the diode to pull the voltage at the HSS output down to zero volts while the HSS is in the off mode and an open load scenario has occurred;
measuring the voltage at the output of the HSS;
detecting that the voltage is zero volts;
determining, based on detecting zero volts, that the open load scenario has occurred; and
reporting the open load scenario to a controller.

11. The method of claim 10, further comprising:
after reporting the open load scenario, initiating the test to determine the fault scenario;
putting the HSS into the off mode;
measuring the voltage at the output of the HSS;
detecting that the voltage has a value other than zero volts;
determining, based on detecting that the voltage is not zero volts, that a short-to-battery scenario is occurring; and
reporting the short-to-battery scenario to the controller.

12. The method of claim 10, wherein the load device is a camera.

13. The method of claim 10, wherein the ECU is a portion of an automobile system.

14. The method of claim 10, wherein the power supply is a switched mode power supply.

15. The method of claim 10, wherein the HSS comprises a plurality of field effect transistors.

16. The method of claim 15, wherein each of the plurality of field effect transistors is configured to connect and disconnect power from the power supply to a separate load device of a plurality of load devices.

17. The method of claim 10, wherein the coaxial cable provides power to the load device while also providing load device data to the ECU.

18. The method of claim 17, wherein the ECU is configured to process, at least in part, the load device data received from the load device.

* * * * *